United States Patent
Komuro et al.

(10) Patent No.: US 7,553,765 B2
(45) Date of Patent: Jun. 30, 2009

(54) METHOD OF MANUFACTURING THIN-FILM ELECTRONIC DEVICE HAVING A THROUGH-HOLE EXTENDING THROUGH THE BASE AND IN COMMUNICATIVE CONNECTION WITH AN OPENING IN THE ELECTRICALLY CONDUCTIVE LAYER

(75) Inventors: Eiju Komuro, Tokyo (JP); Osamu Shinoura, Tokyo (JP); Yumiko Ozaki, Tokyo (JP); Akira Shibue, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/490,164

(22) Filed: Jul. 21, 2006

(65) Prior Publication Data

US 2007/0026581 A1   Feb. 1, 2007

(30) Foreign Application Priority Data

Jul. 29, 2005   (JP)   ............... P2005-221641

(51) Int. Cl.
*H01L 21/44* (2006.01)
(52) U.S. Cl. ............... 438/667; 438/668; 257/E21.008
(58) Field of Classification Search ................ 438/239, 438/244, 250, 253, 381, 667, 668, 669; 257/698, 257/E21.535, E23.011, E23.067, E23.174, 257/E23.19, 276, 621, E21.008, E23.069
See application file for complete search history.

(56) References Cited

U.S. PATENT DOCUMENTS

| 6,005,197 | A  | * | 12/1999 | Kola et al. .............. 174/260 |
| 6,212,057 | B1 | * | 4/2001  | Kohara et al. ........... 361/301.4 |
| 6,653,574 | B2 | * | 11/2003 | Tsai et al. ............... 174/260 |
| 6,759,257 | B2 | * | 7/2004  | McCormack et al. ....... 438/15 |
| 6,910,266 | B2 | * | 6/2005  | Lee et al. ................ 29/832 |
| 2006/0223226 | A1 | * | 10/2006 | Guzek et al. .............. 438/106 |

FOREIGN PATENT DOCUMENTS

| JP | A 11-260148  | 9/1999 |
| JP | A 2004-048045 | 2/2004 |

* cited by examiner

*Primary Examiner*—Khiem D Nguyen
(74) *Attorney, Agent, or Firm*—Oliff & Berridge, PLC

(57) ABSTRACT

A method of manufacturing a thin-film electronic device comprising providing a dielectric layer on a base, providing a first electrically conductive layer having a first opening and covering at least part of the dielectric layer; and forming a first through-hole extending through the base and communicating with the first opening. A second electrically conductive layer may be provided on the base, and a dielectric layer may be provided so as to cover at least part of this second conductive layer.

9 Claims, 6 Drawing Sheets

| POWER (W) | INCIDENT DIAMETER D1 (μm) | EXIT DIAMETER D2 (μm) | D2/D1 | TIME REQUIRED FOR FORMING ONE THROUGH-HOLE | SHORT-CIRCUIT PROBABILITY |
|---|---|---|---|---|---|
| 2.4 | 180 | 40 | 0.22 | 1.8 | 0% |
| 2.6 | 100 | 40 | 0.4 | 0.6 | 0% |
| 2.8 | 80 | 40 | 0.5 | 0.4 | 0% |
| 3.0 | 70 | 40 | 0.57 | 0.33 | 3% |
| 3.2 | 65 | 40 | 0.62 | 0.31 | 20% |

*Fig.6*

| OPENING DIAMETER D3 (μm) | EXIT DIAMETER D2 (μm) | D3/D2 | SHORT-CIRCUIT PROBABILITY |
|---|---|---|---|
| 60 | 40 | 1.5 | 0% |
| 50 | 40 | 1.25 | 0% |
| 40 | 40 | 1 | 0% |
| 30 | 40 | 0.75 | 0% |
| 20 | 40 | 0.5 | 5% |
| 10 | 40 | 0.25 | 20% |
| 0(NONE) | 40 | 0 | 20% |

METHOD OF MANUFACTURING THIN-FILM ELECTRONIC DEVICE HAVING A THROUGH-HOLE EXTENDING THROUGH THE BASE AND IN COMMUNICATIVE CONNECTION WITH AN OPENING IN THE ELECTRICALLY CONDUCTIVE LAYER

BACKGROUND OF THE INVENTION

1. Field of the Invention

The present invention relates to a method of manufacturing a thin-film electronic device.

2. Related Background Art

Japanese Laid-Open Patent Applications H11-260148 and 2004-48045 each disclose a thin-film electronic device formed on a substrate having a through-hole. This through-hole is used to produce a via that electrically connects wiring on the front side of the substrate to wiring on the back side thereof, for example. As discussed in Japanese Laid-Open Patent Application H11-260148, a laser can be used to form the through-hole.

SUMMARY OF THE INVENTION

The production of a thin-film electronic device formed on a substrate having a through-hole can be roughly classified into two methods. One is a method in which the electronic device is produced after the through-hole has been made, and the other is a method in which the through-hole is made after the electronic device has been produced on the substrate.

Many problems are encountered when an electronic device is produced after a through-hole has been made in a substrate. For example, the material packed into the through-hole diffuses onto the substrate or onto the electronic device in the subsequent heat treatment; the location of the through-hole moves away from the intended location in the subsequent heat treatment; and because there is a through-hole in the substrate, if the front of the substrate is coated with a solution of a photoresist or the like, the solution ends up going through the hole and reaching the back side of the substrate.

On the other hand, a method of manufacturing a thin-film electronic device is an example of a method in which a through-hole is made after an electronic device has been produced on a substrate. When, for instance, an electrode layer having a certain pattern is provided on the front of the substrate, and a through-hole is then made from the back of the substrate so as to pass through the substrate and the electrode layer, it is likely for the material of the electrode layer to scatter. The scattered electrode material can adhere to the electrode layer and break the pattern thereof, and if another electrically conductive layer is formed on the front of the substrate, this electrically conductive layer can be short-circuited to the electrode layer, thereby degrading the performance of the thin-film electronic device.

It is an object of the present invention to provide a method of manufacturing a thin-film electronic device with less scattering of electrode material in the formation of a through-hole, thereby making it unlikely to degrade the performance of the thin-film electronic device.

The present invention relates to a method of manufacturing a thin-film electronic device. The method comprises: forming a first electrically conductive layer over a base; forming a first opening so as to obtain a first main portion and a first island from the first electrically conductive layer; providing a dielectric layer including a second opening, on the first main portion and filling the first opening with the dielectric layer; forming a second electrically conductive layer including a third opening, a second main portion, and a second island which is separated from the second main portion by the third opening, so as to cover at least part of the dielectric layer, and in order that the second main portion contacts with the first island of the first electrically conductive layer at a first contact region, and in order that the second island contacts with the first main portion and fills the second opening at a second contact region; forming a fourth opening at the first contact region of the second main portion and the first island; forming a fifth opening at the second contact region of the first main portion and the second island; forming a first through-hole extending through the base to be in communicative connection with the fourth opening, which is hollow after forming the fourth opening at the first contact region; and forming a second through-hole extending through the base to be in communicative connection with the fifth opening which is hollow after forming the fifth opening at the second contact region.

The method may further comprise forming a via by adhering an electrically conductive material to an inner face of the fourth opening and to an inner face of the first through-hole.

The fourth opening may be formed so as to extend from a lower surface of the first electrically conductive layer to an upper surface of the second electrically conductive layer.

The method may further comprise forming a via by adhering an electrically conductive material in the inner face of the second opening and to the inner face of the second through-hole.

The providing a dielectric layer may include preparing a first electrically conductive layer as the base, and providing the dielectric layer on the first conductive layer.

The base may include a plate having a first surface and a second surface opposing to each other. The providing the dielectric layer may include providing the dielectric layer on the first surface of the base. The forming the through-hole may include boring the through-hole from the second surface of the base.

The forming the first through-hole may include forming the through-hole by irradiating the base with a laser beam.

The fourth opening may be formed after the second electrically conductive layer is formed above the base. In addition, the fourth opening and the first through-hole may be continuously formed. Further the fourth opening and the first through-hole may be formed without any structures intervening therebetween.

The present invention will become more fully understood from the detailed description given hereinbelow and the accompanying drawings which are given by way of illustration, and thus are not to be considered as limiting the present invention.

BRIEF DESCRIPTION OF THE DRAWINGS

FIG. 5 is a table showing how the ratio between incident diameter D1 and exit diameter D2 changes, and FIG. 6 is a table showing the probability of short-circuit in a thin-film capacitor.

DESCRIPTION OF THE PREFERRED EMBODIMENTS

Embodiments of the present invention will now be described in detail with reference to the accompanying drawings. In the description of the drawings, identical symbols are used for identical elements, and these elements will not be explained repeatedly.

Figure 1:
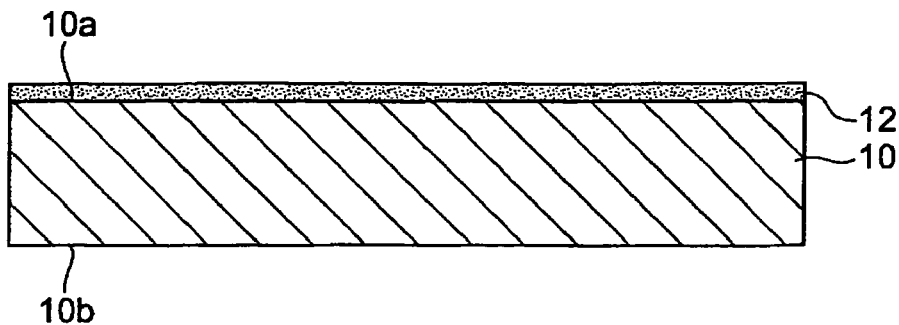
FIGS. 1 to 3 are schematic sectional views illustrating a method of manufacturing a thin-film electronic capacitor in accordance with an embodiment of the invention.
Figure 1:
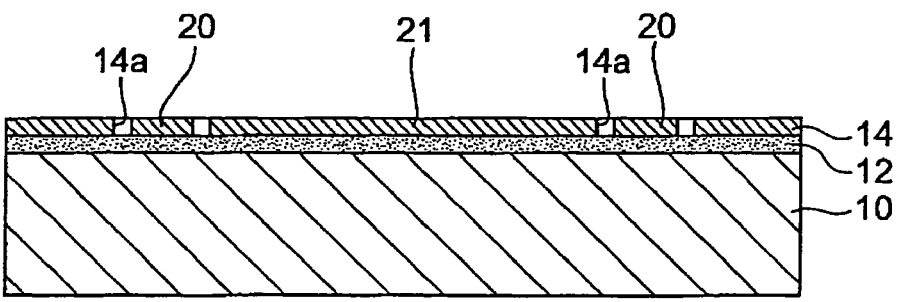
Figure 1:
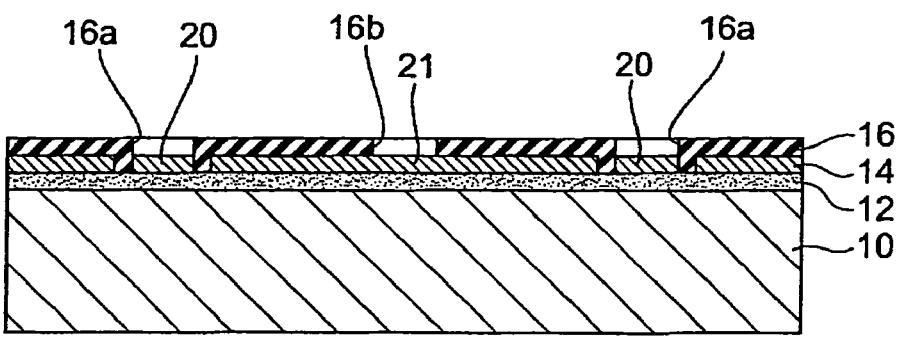
Figure 1:
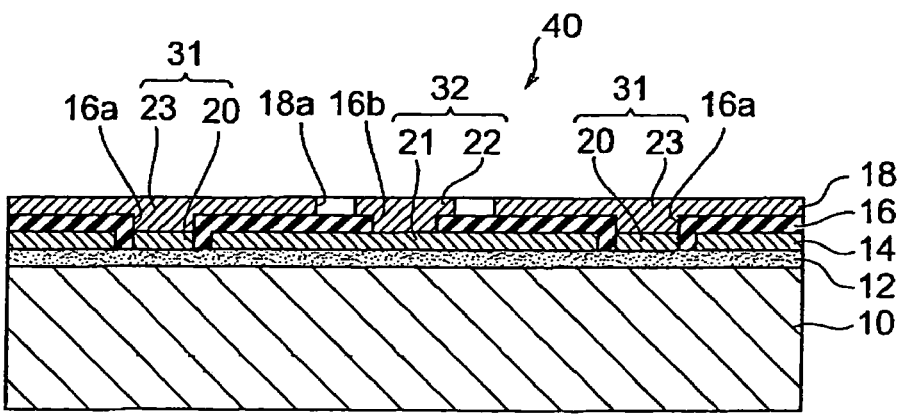
Figure 2:
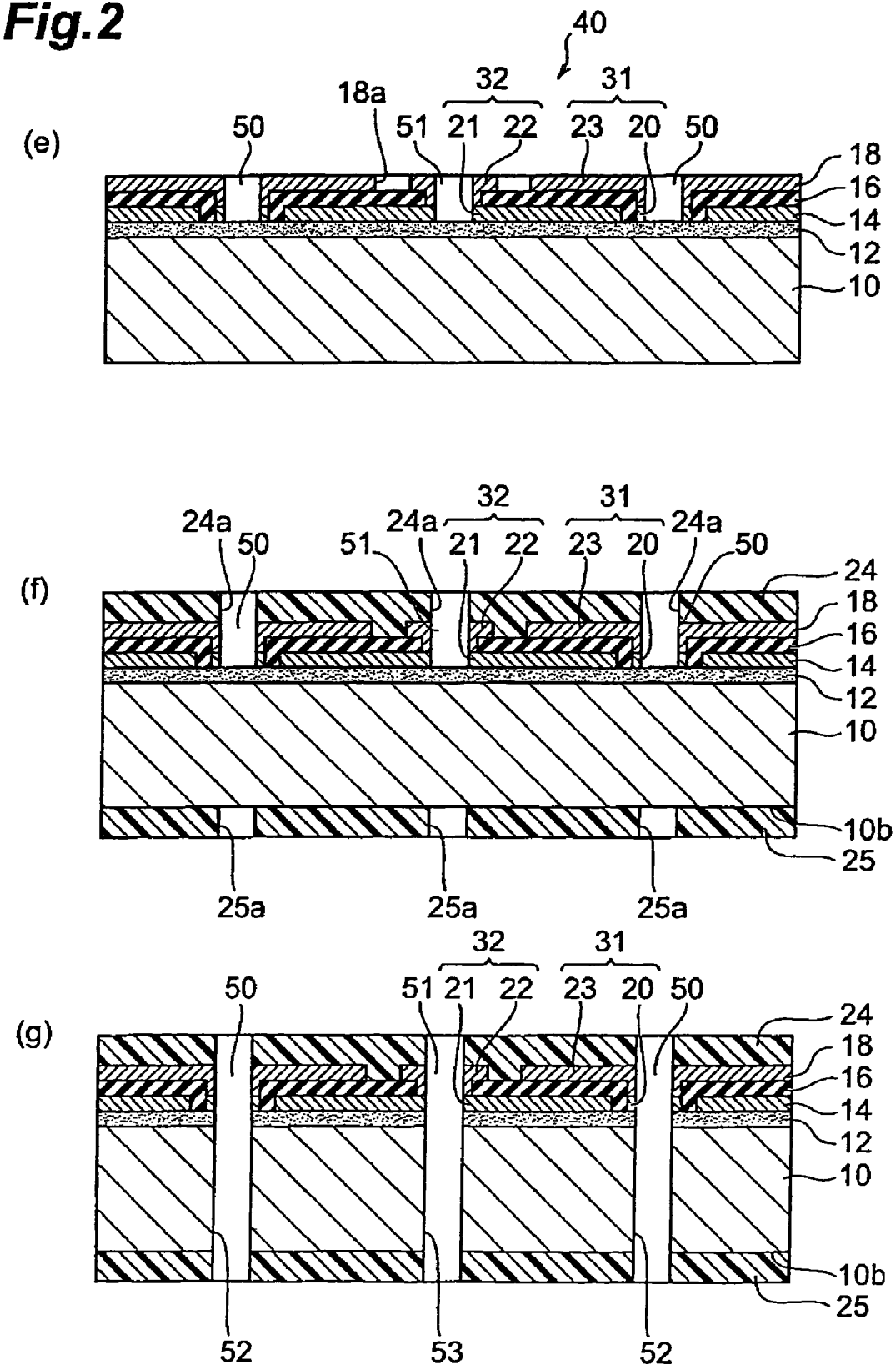
Figure 3:
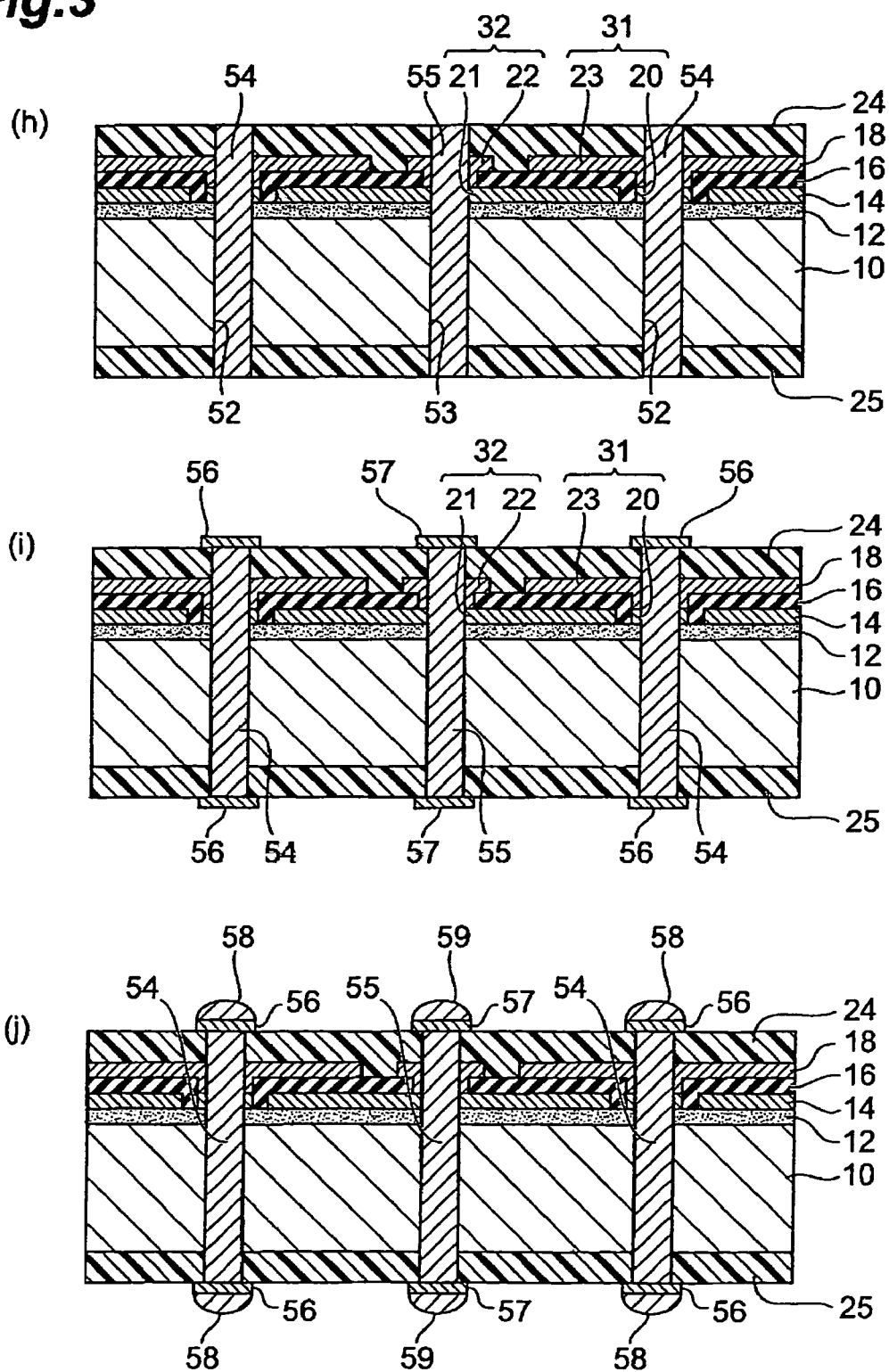

FIGS. 1 to 3 are schematic sectional views illustrating a method of manufacturing a thin-film electronic device in accordance with the embodiment. In this embodiment, a thin-film capacitor is manufactured as a thin-film electronic device. First, as shown in FIG. 1(a), a substrate 10 made of alumina is prepared, and one surface 10a of the substrate 10 is polished and planarized, and then this surface 10a is covered with an insulating film 12. The surface 10a of the substrate 10 is a face on which a thin-film capacitor is formed, and will hereinafter be called the front face. The other surface 10b of the substrate 10 will be called the back face. The insulating film 12 is made of $SiO_2$ glass, and can be formed by plasma CVD, chemical solution deposition (CSD), or other such methods.

Then, as shown in FIG. 1(b), a lower electrode layer 14 is formed over the insulating film 12 by any desired film-formation methods. The lower electrode layer 14 is patterned by photolithography or the like to form openings 14a. Each opening 14a is a groove having a circular ring shape in plan view, and extends from the top face of the lower electrode layer 14, through the lower electrode layer 14, to the top face of the insulating film 12. An island 20 that is separated from the main portion 21 of the lower electrode layer 14 remains on the inner side of each opening 14a. The islands 20 have a circular shape in plan view.

Next, as shown in FIG. 1(c), a dielectric layer 16 having a high dielectric constant is formed on the lower electrode layer 14. This dielectric layer 16 is made of BST (barium strontium titanate). The dielectric layer 16 fills the openings 14a and comes into contact with the insulating film 12. The dielectric layer 16 is patterned by photolithography or the like so as to have a plurality of openings, 16a and 16b. The dielectric layer 16 may be provided with one or more openings 16a and also one or more openings 16b. These openings have a circular shape in plan view. The openings 16a are positioned above the islands 20 of the lower electrode layer 14. Accordingly, the surfaces of the islands 20 are exposed through the openings 16a. The openings 16b are provided over the main portion 21 of the lower electrode layer 14. Accordingly, part of the surface of the main portion 21 is exposed through the openings 16b.

After this, as shown in FIG. 1(d), an upper electrode layer 18 that covers the dielectric layer 16 is produced by any desired film formation methods. The upper electrode layer 18 fills the openings 16a and 16b in the dielectric layer 16 and comes into contact with the lower electrode layer 14. The upper electrode layer 18 is provided with one or more openings 18a above the main portion 21 of the lower electrode layer 14. The openings 18a are grooves each having a circular ring shape in plan view, and extend from the top face of the upper electrode layer 18, through the upper electrode layer 18, to the top face of the dielectric layer 16. An island 22 that is apart from the main portion 23 of the upper electrode layer 18 remains inside each opening 18a. The islands 22 have a circular shape in plan view.

The main portion 23 of the upper electrode layer 18 fills the openings 16a in the dielectric layer 16, and comes into contact with the island 20 of the lower electrode layer 14. As a result, the islands 20 and the main portion 23 act as a capacitor-electrode layer 31. Also, the island 22 of the upper electrode layer 18 fills the openings 16b in the dielectric layer 16, and comes into contact with the main portion 21 of the lower electrode layer 14. As a result, the islands 22 and the main portion 21 act as a capacitor-electrode layer 32. These capacitor-electrode layers 31 and 32 are electrically insulated by the dielectric layer 16. This yields a thin-film capacitor 40 having a structure in which the dielectric layer 16 is sandwiched between the two capacitor-electrode layers 31 and 32.

Next, a via is provided to the substrate 10 so that electrical connection to the capacitor-electrode layers 31 and 32 is ensured on the opposite sides of the substrate 10. First, as shown in FIG. 2(e), one or more openings 50 passing through the capacitor-electrode layer 31, and one or more openings 51 passing through the capacitor-electrode layer 32 are provided. These openings 50 and 51 extend from the upper surface of the upper electrode layer 18 to the upper surface of the insulating film 12. These openings 50 and 51 have a circular lateral cross section. The openings 50 and 51 can be formed by any desired hole-making methods, such as ion milling.

Next, as shown in FIG. 2(f), passivation films 24 and 25 are made on both the sides of the substrate 10. The passivation film 24 is patterned so as to cover the upper electrode layer 18 and to have openings 24a aligned with the openings 50 and 51. The passivation film 25 is patterned so as to cover the back face 10b of the substrate 10 and to have openings 25a provided right below the openings 50 and 51.

Then, as shown in FIG. 2(g), holes 52 and 53, are made which extends through the substrate 10 and the insulating film 12. There may be one or more through-holes 52 and also one or more through-holes 53. The through-holes 52 are in communicative connection with the openings 50, and have a lateral cross section that is substantially circular. In this embodiment, the through-holes 52 have a diameter that is substantially equal to that of the openings 50, but may have a diameter that is smaller than that of the openings 50. Similarly, the through-holes 53 are in communicative connection with the openings 51, and have a lateral cross section that is substantially circular. In this embodiment, the through-holes 53 have a diameter that is substantially equal to that of the openings 51.

These through-holes 52 and 53 are started from the back face 10b of the substrate 10, and are made by laser drilling, micro-drilling, or other such methods. When laser drilling is used, for example, the back face 10b of the substrate 10 is irradiated with a laser beam through each opening 25a in the passivation film 25, and the drilling of the holes proceeds from there. These holes are formed substantially perpendicular to the back face 10b of the substrate 10, extend through the insulating film 12, and communicate with the openings 50 and 51. The through-holes 52 and 53 are formed in this way.

The following are the typical apparatus and conditions used in laser drilling.

Type of laser: UV LASER μ VIA DRILL, model 5320, made by ESI

Light source: UV-YAG

Machining: spiral method (the laser is directed in a spiral from the center of the opening to the outermost periphery)

Laser output: 2.8 V

Shot count: 100 shots

Figure 4:
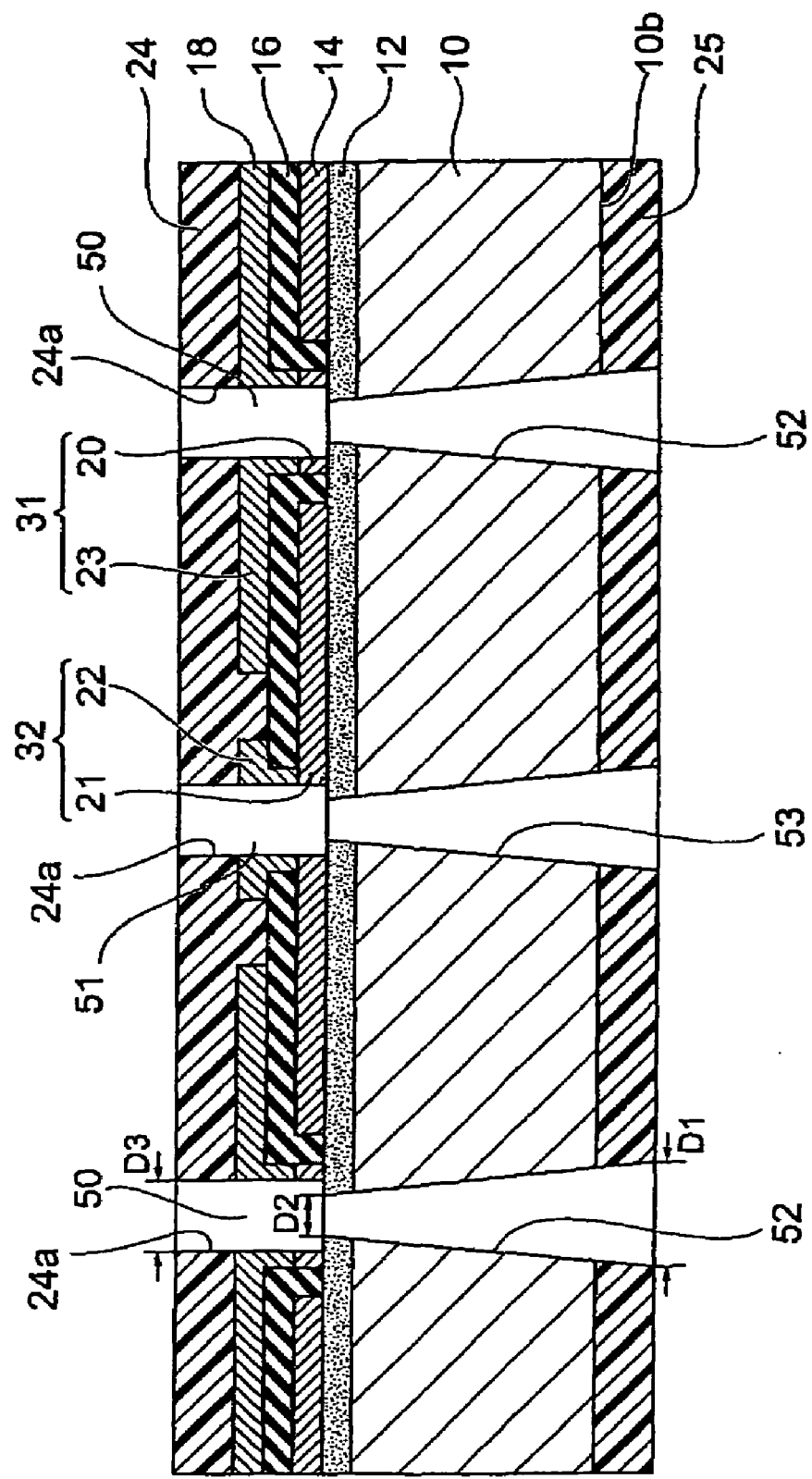
FIG. 4 is a schematic sectional view illustrating the difference in diameter at the opposite ends of a through-hole.

The purpose of irradiating the back face 10b of the substrate 10 with the laser beam is to prevent damage to the thin-film capacitor 40 formed on the front face 10a. In general, as shown in FIG. 4, the incident diameter D1 of the laser beam tends to be larger than the exit diameter D2 thereof in laser drilling. Consequently, if the front face 10a is irradiated with the laser beam, it is likely the thin-film capacitor 40 is damaged.

Next, as shown in FIG. 3(h), the through-holes 52 and 53 are filled with electrically conductive material to form vias 54 and 55 extending from one side of the substrate 10 to the other. Silver and copper are examples of this conductive material. The through-holes 52 and 53 may be completely filled with the conductive material, or the conductive material may adhere only to the inner faces of the through-holes 52 and 53. The vias 54 and 55 are in contact with the first and second capacitor-electrode layers 31 and 32, respectively, and thus electrically connected to these electrode layers.

As shown in FIG. 3(i), UBM (Under Bump Metal) 56 and 57 are made on the opposite ends of the vias 54 and 55. The UBM 56 and 57 are pad-shaped electrodes electrically connected to the vias 54 and 55, respectively. As shown in FIG. 3(j), solder bumps 58 and 59 are provided over the UBM 56 and 57, respectively. The solder bumps 58 and 59 are used to connect the substrate 10 on which the thin-film capacitor 40 is mounted (or a chip obtained by dicing the substrate 10) to another chip.

The advantages of this embodiment will now be described. In this embodiment, the openings 50 and 51 are formed in the capacitor-electrode layers 31 and 32 on the front face 10a of the substrate 10, and the through-holes 52 and 53 are made from the back face 10b of the substrate 10 so as to be in communicative connection with the opening 50. Accordingly, the material of the capacitor-electrode layers 31 and 32 is unlikely to scatter during the formation of the through-holes 52 and 53, comparing to the case where through-holes are formed by perforating the capacitor-electrode layers 31 and 32 and the substrate 10 in a single step.

If the material of the capacitor-electrode layers 31 and 32 scattered during the formation of the through-holes 52 and 53, the scattered material could adhere to the capacitor-electrode layers 31 and 32 and break the pattern thereof, or if another dielectric layer were provided over the substrate 10, the other dielectric layer and the capacitor-electrode layer 31 could be short-circuited by the scattered electrode material, thereby degrading the performance of the thin-film capacitor 40. On the other hand, in this embodiment, the scattering of the electrode material is suppressed, and thus it is possible to reduce or prevent the degradation of the performance of the thin-film capacitor 40.

Even if the openings 50 and 51 do not go all the way through the capacitor-electrode layers 31 and 32, the electrode material that is scattered during the formation of the through-holes will be reduced according to the volume of the openings 50 and 51. However, the scattering of the electrode material can be suppressed even more if the openings 50 and 51 go all the way through the electrode layers. Platinum, for instance, is favorable as an electrode material because of its high strength, but on the other hand it is a relatively brittle metal. Consequently, if platinum is used as the electrode material, there is a strong likelihood that the scattering will occur during formation of the through-holes. Thus, the present invention can be preferably applied in particular to devices in which platinum electrodes are used.

The suitable power level for the laser beam used to form the through-holes 52 and 53 will now be studied. The inventors actually manufactured the thin-film capacitor 40 multiple times by the above method. Laser drilling was carried out to form the through-holes 52 using a laser beam having the power level changed each time. As shown in FIG. 4, the through-holes 52 and 53 thus formed had the incident diameter D1 different from the exit diameter D2. The laser drilling was performed so that the exit diameter D2 of the through-holes 52 and 53 was 40 µm. The diameter of the openings 50 and 51 formed in the capacitor-electrode layers 31 and 32 was also 40 µm.

The ratio between the incident diameter D1 and the exit diameter D2 can be varied by changing the power of the laser beam. FIG. 5 is a table showing how the ratio between the incident diameter D1 and the exit diameter D2 changes as a function of the power level of the laser beam.

As shown in FIG. 5, as the laser beam power drops, the incident diameter D1 increases. Also, it can be seen that the greater is the ratio between the incident diameter D1 and the exit diameter D2, the greater is the probability that short-circuit occurred in the thin-film capacitor 40. If the ratio, D2/D1, of the exit diameter D2 to the incident diameter D1 is 0.5 or less, the probability of short-circuit in the thin-film capacitor 40 is 0%. When D2/D1 is 0.57, the short-circuit probability is 3%, whereas it increases to 20% when D2/D1 is 0.62.

On the other hand, when the laser beam power is lowered, the short-circuit probability decreases, but more time is necessary to form one through-hole. When the power level was between 3.2 W and 2.8 W (when the ratio, D2/D1, of the exit diameter D2 to the incident diameter D1 is 0.5 or more), the time required to form one through-hole was 0.4 seconds or less, but the time was 0.6 seconds when the power level was 2.6 W (D2/D1 was 0.4). When the power level was 2.4 W (D2/D1 was 0.22), the time required to form one through-hole was 1.8 seconds, which means that it took three times as long as when the power was 2.6 W.

Next, the suitable diameter of the openings 50 and 51 formed in the capacitor-electrode layers 31 and 32 will now be studied. The inventors actually manufactured the thin-film capacitor 40 multiple times by the above method. The openings 50 and 51 were formed in a diameter changed each time, and then the through-holes 52 and 53 were made by laser drilling. The diameter of the openings 50 and 51 can be varied by changing the photomask used in the photolithography step. The conditions concerning to the laser beam used in the laser drilling were held constant, and the exit diameter D2 of the through-holes 52 and 53 was fixed at 40 µm.

FIG. 6 is a table showing the relationship between the diameter D3 of the openings 50 and 51 and the probability that short-circuit occurred in the thin-film capacitor 40.

As shown in FIG. 6, when the ratio, D3/D2, of the opening diameter D2 to the exit diameter D2 is 0.75 or more, the probability of short-circuit in the thin-film capacitor 40 is 0%. When D3/D2 is 0.5, the short-circuit probability is 5%, whereas it increases to 20% when D3/D2 is 0.25 or less.

Thus, if the diameter of the openings 50 and 51 is increased, there is a lower probability of short-circuit in the thin-film capacitor 40. Increasing the diameter of the openings, however, reduces the surface area of the portion that acts as a capacitor. Therefore, if the opening diameter and the exit diameter are the same, or if the opening diameter is smaller than the exit diameter, it is possible to minimize the reduction in the surface area of the portion that acts as a capacitor.

In the foregoing, the present invention is explained in detail with reference to its embodiment. However, the present invention is not restricted to the above-mentioned embodiment. The present invention can be modified in various manners within the scope not deviating from its gist.

The present invention is not limited to a method of manufacturing a thin-film capacitor, and can also be applied to a method of manufacturing any other thin-film electronic devices. For instance, the present invention can be adequately applied to an electronic device with a platinum electrode (which, as mentioned above, is a brittle material), such as a solid electrolyte sensor. In the above embodiment, the substrate 10 is used as the base, and the insulating film 12 and lower electrode layer 14 are formed on this substrate 10, but the insulating film 12 and lower electrode layer 14 may be unnecessary, depending on the type of the thin-film electronic device to be manufactured. Also, the lower electrode layer 14 may be used as the base instead of the substrate 10, and the substrate 10 and insulating film 12 may be omitted. In this case, it is preferable for the lower electrode layer 14 to be thick enough to have the necessary strength.

In the above embodiment, the openings 50 and 51 are made after the formation of the capacitor-electrode layers 31 and 32, but the openings 50 and 51 may instead be provided by patterning in the course of forming the capacitor-electrode layers 31 and 32.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A method of manufacturing a thin-film electronic device, comprising:
   forming a first electrically conductive layer over a base;
   forming a first opening so as to obtain a first main portion and a first island from the first electrically conductive layer;
   providing a dielectric layer including a second opening, on the first main portion and filling the first opening with the dielectric layer;
   forming a second electrically conductive layer including a third opening, a second main portion, and a second island which is separated from the second main portion by the third opening, so as to cover at least part of the dielectric layer, and in order that the second main portion contacts with the first island of the first electrically conductive layer at a first contact region, and in order that the second island contacts with the first main portion and fills the second opening at a second contact region;
   forming a fourth opening at the first contact region of the second main portion and the first island;
   forming a fifth opening at the second contact region of the first main portion and the second island;
   forming a first through-hole extending through the base to be in communicative connection with the fourth opening, which is hollow after forming the fourth opening at the first contact region; and
   forming a second through-hole extending through the base to be in communicative connection with the fifth opening which is hollow after forming the fifth opening at the second contact region.

2. A method according to claim 1, further comprising forming a via by adhering an electrically conductive material to an inner face of the fourth opening and to an inner face of the first through-hole.

3. A method according to claim 1, wherein in the fourth opening forming step, the fourth opening is formed so as to extend from a lower surface of the first electrically conductive layer to an upper surface of the second electrically conductive layer.

4. A method according to claim 1, wherein the providing a dielectric layer includes preparing a first electrically conductive layer as the base, and providing the dielectric layer on the first conductive layer.

5. A method according to claim 1, wherein the base includes a plate having a first surface and a second surface opposing to each other,
   the providing the dielectric layer includes providing the dielectric layer on the first surface of the base, and
   the forming the first through-hole includes boring the first through-hole from the second surface of the base.

6. A method according to claim 1, wherein the forming the first through-hole includes forming the first through-hole by irradiating the base with a laser beam.

7. A method according to claim 1, wherein the fourth opening is formed after the second electrically conductive layer is formed above the base.

8. A method according to claim 1, wherein the fourth opening and the first through-hole are continuously formed.

9. A method according to claim 1, wherein the fourth opening and the first through-hole are formed without any structures intervening therebetween.

* * * * *